United States Patent [19]

Schoenbach et al.

[11] Patent Number: 4,825,061
[45] Date of Patent: Apr. 25, 1989

[54] OPTICALLY CONTROLLED BULK SEMICONDUCTOR SWITCH NOT REQUIRING RADIATION TO SUSTAIN CONDUCTION

[75] Inventors: Karl H. Schoenbach; Rudolf K. F. Germer, both of Norfolk; Vishnukumar K. Lakdawala; Sacharia Albin, both of Virginia Beach, all of Va.

[73] Assignee: Center for Innovative Technology, Herndon, Va.

[21] Appl. No.: 82,546

[22] Filed: Aug. 7, 1987

[51] Int. Cl.$^4$ ............................................. H01J 40/14
[52] U.S. Cl. .............................. 250/211 R; 250/211 J; 357/17
[58] Field of Search ......................... 250/211 R, 211 J; 357/19, 30, 30 B, 30 M, 30 N, 17

[56] References Cited

U.S. PATENT DOCUMENTS

| | | | |
|---|---|---|---|
| 3,555,282 | 1/1971 | Vanai et al. | 250/211 J |
| 3,832,732 | 8/1974 | Roberts | 357/19 |
| 3,917,943 | 11/1975 | Auston | 250/211 J |
| 4,001,865 | 1/1977 | Voss | 357/38 |
| 4,063,130 | 12/1977 | Hunter, Jr. | 315/150 |
| 4,240,088 | 12/1980 | Myers | 357/19 |
| 4,376,285 | 3/1983 | Leonberger et al. | 357/17 |
| 4,396,833 | 8/1983 | Pan | 250/211 J |
| 4,438,331 | 3/1984 | Davis | 250/211 J |
| 4,626,883 | 12/1986 | Kash et al. | 357/30 |
| 4,626,884 | 12/1986 | Shannon | 357/30 |

OTHER PUBLICATIONS

Weiner, M., "Group Report on Solid State Opening Switches," *Proceedings, Solid State Switches for Pulsed Power*, ed. by W. Portnoy and M. Kristiansen, Tamarron, Co, pp. 189-201, 1983.

Nunnally, W. C., "Photoconductive Pulse Power Switches: A Review," *Proc. 5th IEEE Pulsed Power Conf.*, Arlington, VA, pp. 235-241, 1985.

Zutavern, F. J., O'Malley, M. W., "Engineering Limits of Photoconductive Semiconductor Switches in Pulsed Power Applications," *IEEE Conference Record of the Seventeenth Power Modulator Symposium*, Seattle, WA, pp. 214-218, 1986.

Broser, I., Germer, R., Seliger, F., Schulz, H. J., "Luminescence of an M Center in ZnS," *J. Phys. Chem. Solids*, vol. 41, pp. 101-107, 1980.

Kullendorf, N., Jansson, L., Ledebo, L. A., "Copper-Related Deep Level Defects in III-V Semiconductors," *J. Appl. Phys.*, vol. 54, pp. 3203-3312, 1983.

Morse, J. D., Pocha, M. D., "Characteristics and Modeling of High Voltage Photoconductive Switching Devices," *IEEE Conference Record of the Seventeenth Power Modulator Symposium*, Seattle, WA, pp. 211-213, 1986.

Bovino, L., Youmans, R., Weiner, M., Burke, T., "Optically Controlled Semiconductor Switch for Multi--Megawatt Rep-Rated Pulsers," *IEEE Conference Record of the Seventeenth Power Modulator Symposium*, Seattle, WA, pp. 219-223, 1986.

*Primary Examiner*—David C. Nelms
*Assistant Examiner*—Stephone B. Allen
*Attorney, Agent, or Firm*—Staas & Halsey

[57] ABSTRACT

A light activated semiconductor switch is capable of carrying large currents without requiring continuous illumination of the semiconductor to sustain conduction. The switch includes a block of semiconductor material having ohmic contacts connectable to first and second electrical conductors and a deep acceptor level between conduction and valence bands that may be counterdoped with shallow donors. The source of light used to switch between the ON and OFF states is an electromagnetic radiation device which directs first and second beams onto the block between the ohmic contacts. The first beam causes photo-excitation of electrons form the deep acceptor level into the conduction band to provide initial electrons for conduction between the first and second electrical conductors. The second beam causes electrons from the conduction band and holes from the deep acceptor level to combine, thereby interrupting conduction between the first and second electrical conductors.

16 Claims, 4 Drawing Sheets

OPTICALLY CONTROLLED BULK SEMICONDUCTOR SWITCH NOT REQUIRING RADIATION TO SUSTAIN CONDUCTION

ORIGIN OF THE INVENTION

This invention was made with Government support under contract N00014-86-K-0560 awarded by the Department of the Navy. The government has certain rights in the invention.

BACKGROUND OF THE INVENTION

1. Field of the Invention

The present invention is related to optically controlled bulk semiconductor switches and, more particularly, to a switch which does not require light to sustain conduction and is capable of high current gain and high current density.

2. Description of the Related Art

Many varieties of optically controlled semiconductor switches exist. They are commonly used in photodiodes, phototransistors, photothyristors and light sensitive resistors of many types. The most commonly used light-sensitive semiconductor device is the photodiode which is used in many applications, including fiber optic communication systems, etc. The currents handled by such devices are relatively low, typically in the milliampere range. One example is the PIN diode taught by U.S. Pat. No. 4,240,088 to Myers. Other light-activated devices include the thyristors taught by U.S. Pat. Nos. 3,832,732 to Roberts and 4,001,865 to Voss, the microwave switching circuit taught by U.S. Pat. No. 4,396,833 to Pan and many other patents. Some, such as U.S. Pat. Nos. 4,626,883 to Kash et al. and 3,917,943 to Auston, describe switching elements with picosecond switching times.

The Auston '943 patent uses light only to control the state of the switch, i.e., whether the switch is ON or OFF, but unlike a photodiode, does not require light to be directed onto the surface of the semiconductor to sustain conduction. In the Auston patent only a shallow region very close to the surface of the semiconductor becomes conductive. The switch is turned OFF by light, having a wavelength different than the initiating light beam, which grounds the switch by directing the flow to a ground plate on the opposite surface of the semiconductor switch.

Other light activated switches, such as those taught by U.S. Pat. Nos. 4,438,331 to Davis and 4,376,285 to Leonberger et al., are able to carry a larger amount of current by making an entire block of semiconductor material conductive; however, like photodiodes, they require continuous light to sustain conduction. Such switches may be satisfactory when they are required to be only briefly closed, but they require unacceptably large amounts of energy for switches which are designed to remain closed for longer periods of time, particularly in view of their relatively low current gain.

Electron-bombarded semiconductor (EBS) devices are another type of high-speed switching device. However, EBS devices are limited in output power and current density due to the space charge limited current condition.

Higher current densities, up to $10^2$ A/cm$^2$ are provided by diffuse discharge switches, such as the switch taught by U.S. Pat. No. 4,0643,130 to Hunter. However, while diffuse discharge switches can be turned ON in less than a nanosecond, they are relatively slow to turn OFF, taking approximately 100 nanoseconds, have a moderate current gain between $10^2$ and $10^3$ and like all EBS, require continuous bombardment by an electron beam to sustain conduction.

SUMMARY OF THE INVENTION

An object of the invention is to provide a semiconductor switch with a current density over $10^4$ A/cm$^2$.

Another object of the present invention is to provide a high current semiconductor switch with an operating voltage drop of less than 100 volts.

Yet another object of the present invention is to provide a light activated switch which does not rely upon light to sustain conduction, but only to control switching.

A further object of the present invention is to provide a light activated switch which does not require light to sustain conduction and turns OFF by interrupting conduction, not by changing the conduction path.

The above objects are attained by providing a switch operatively connectable between first and second electrical conductors, the switch comprising a block of semiconductor material having ohmic contacts operatively connectable to the first and second electrical conductors and having a deep acceptor level between conduction and valence bands; and electromagnetic radiation means for directing a first beam onto the block between the ohmic contacts to cause photoexcitation of electrons from the deep acceptor level into the conduction band to provide initial electrons for conduction between the first and second electrical conductors and for directing a second beam onto the block between the ohmic contacts to cause electrons from the conduction band and holes from the deep acceptor level to recombine, thereby interrupting conduction between the first and second electrical conductors. The first beam has a first wavelength and the second beam has a second wavelength longer than the first wavelength.

Preferably, the photo-excitation cross section for electrons trapped by deep acceptors in the block of semiconductor material is relatively large compared to the hole photo-excitation cross section and the electron capture cross section which is relatively small compared to the hole capture cross section. In addition, the block semiconductor material preferably is formed from a direct semiconductor of substantially uniform consistency. The semiconductor material may consist essentially of gallium arsenide preferably containing at least one of copper and silicon as deep acceptor and shallow donor materials, respectively. Additionally it might contain chromium which generates recombination centers and therefore increases the band-to-band recombination rate. For GaAs, doped with copper, the first wavelength is preferably smaller than approximately 1.15 microns and the second wavelength is preferably between approximately 1.15 and 3.10 microns. The block of semiconductor material may also consist essentially of indium phosphide, preferably including at least one of copper and silicon. In this case, the first wavelength is preferably smaller than approximately 1.55 microns and the second wavelength is preferably between approximately 1.55 and 2.25 microns.

These objects, together with other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENTS

Figure 1:
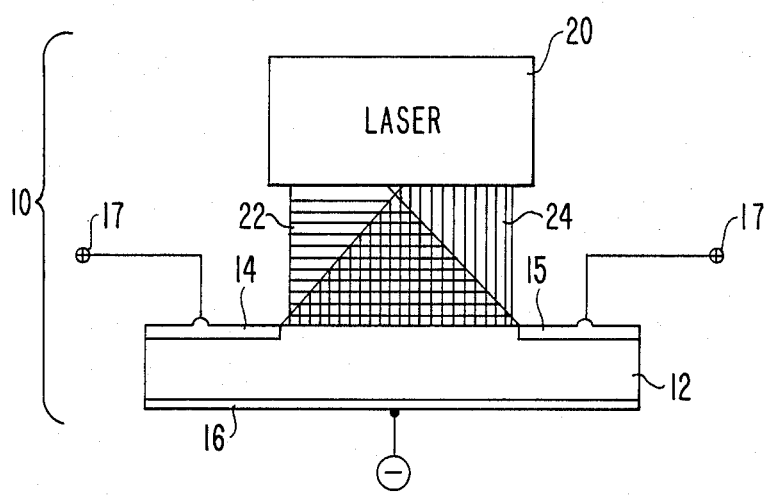
FIG. 1 is a block diagram of an embodiment of the present invention.

As illustrated in FIG. 1, a light activated switch 10 according to the present invention includes a block 12 of semiconductor material with ohmic contacts 14–16 operatively connectable to first and second electrical conductors 17 and 18. A space of a micron to a few centimeters may be used to separate contacts 14 and 15 from each other and from contact 16. Electromagnetic radiation means, such as a laser 20 connected to an appropriate power supply (not shown) is positioned so that a first beam 22 and a second beam 24 are directed onto the block 12 of semiconductor material between the ohmic contacts 14 and 15. The power output by the laser 20 depends on the amount of current handled by the switch with up to 1 MW/cm$^2$ for high current operation of, e.g., 10 kA/cm$^2$.

According to the present invention, the first beam 22 has a first wavelength which causes photo-excitation of electrons from a deep acceptor level in the block 12 of semiconductor material. The excited electrons are raised into the conduction band to provide initial electrons for conduction between the first and second electrical conductors 15 and 16. After the first beam is turned off, conduction continues with electrons supplied by the second conductor 16, as described below in more detail. The second beam 24 has a second wavelength which causes photo-excitation of holes in the block 12 of semiconductor material. This causes electrons from the conduction band and holes from the deep acceptor level to recombine, thus interrupting conduction between the first and second electrical conductors 15 and 16.

The deep acceptor level in the block 12 of semiconductor material is provided by uniformly doping the block 12 of semiconductor material with a substance, such as a d-orbital element, which will provide a deep acceptor level between the conduction and valence bands of the semiconductor material. The dopant substance introduces deep acceptor levels (traps) and may be counterdoped with a second substance such as silicon which introduces a shallow donor level. The electrons from the donor atoms are used to partially fill the deep traps. Where the deep levels are naturally filled with electrons, such counterdoping is unnecessary.

Figure 2:
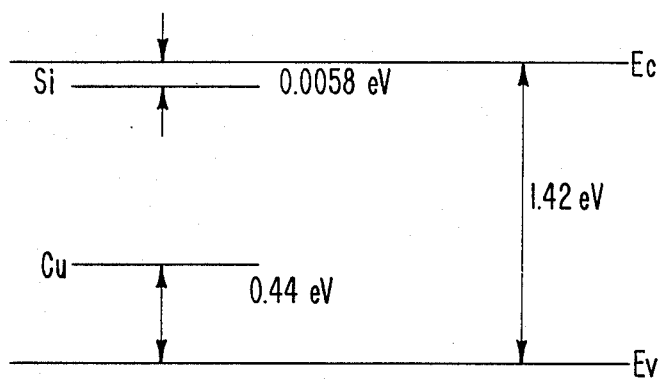
FIG. 2 is a graphical representation of copper related energy levels in gallium arsenide and the silicon donor level.
Figure 3B:
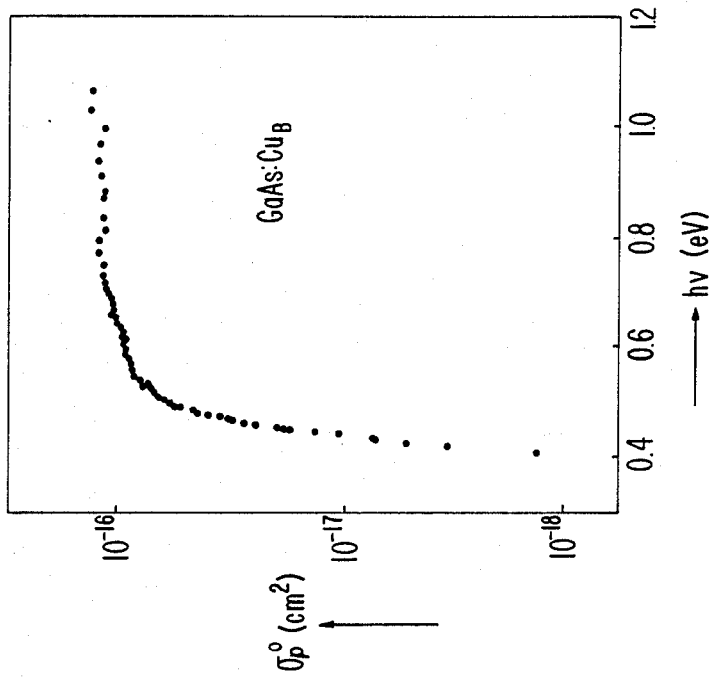
FIGS. 3A and 3B are graphs of the photo-excitation cross section of electrons and holes, respectively, in gallium arsenide containing copper impurities as described in Kullendorff et al., infra.
Figure 3A:
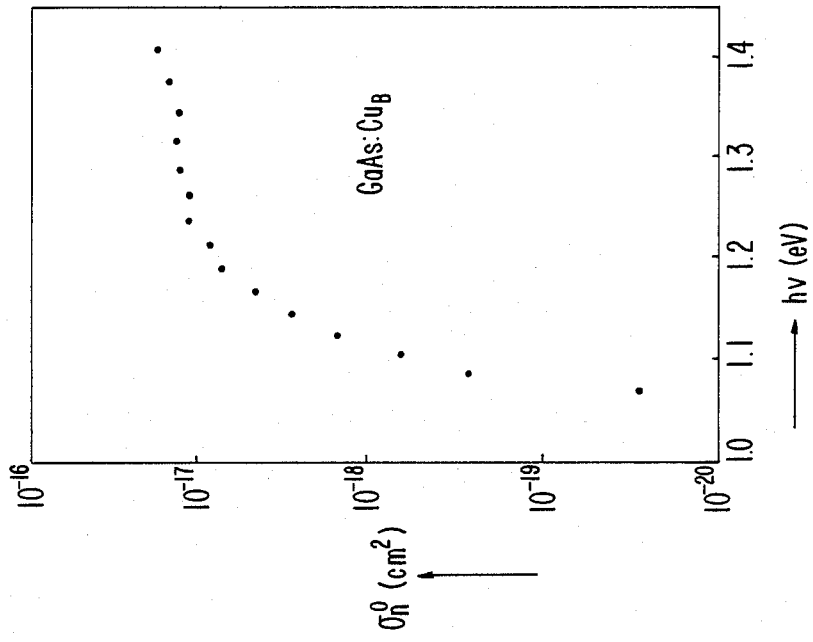
Figure 3D:
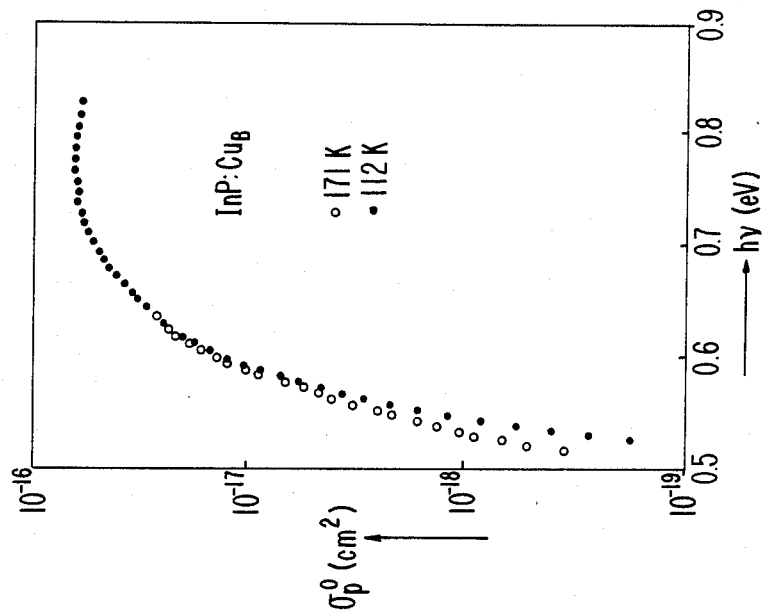
FIGS. 3C and 3D are graphs of photo-excitation cross sections of electrons and holes, respectively, in indium phosphide containing copper impurities as described in Kullendorff et al., infra.
Figure 3C:
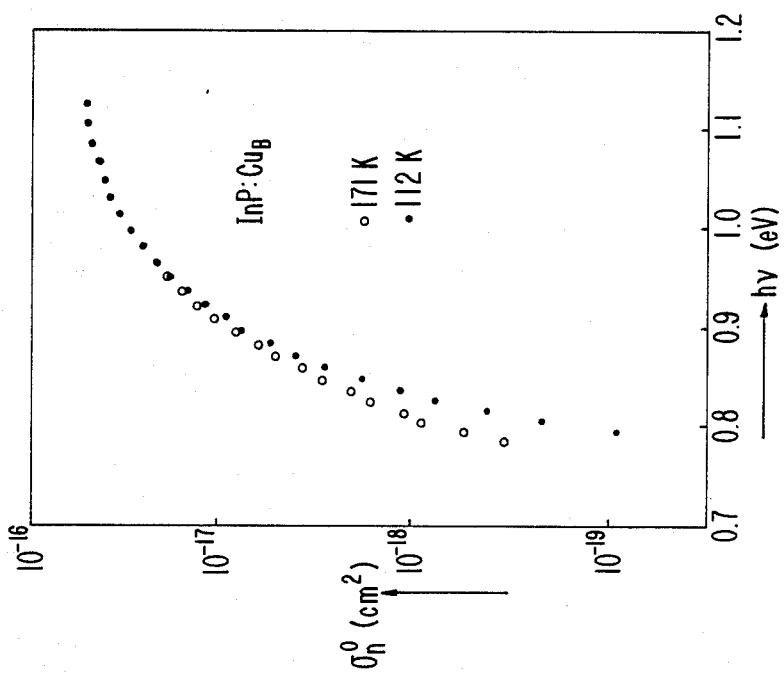

For example, as describe,d in Kullendorff et al., "Copper-related Deep Level Defects in III–V Semiconductors", Journal of Applied Physics, Vol. 54, No. 6, June 1983, copper may be diffused into group III–V semiconductor compounds, such as gallium arsenide, or indium phosphide. In these substances, the quantity of copper may be, for example, 10$^{17}$ atoms/cm$^3$. Copper also forms deep acceptor levels in II–VI semiconductors, such as cadmium sulfide or zinc sulfide. Thus, compounds such as gallium arsenide, indium phosphide, alluminum gallium arsenide, gallium arsenic phosphide, cadmium sulfilde or zinc oxide may be doped with copper to provide a deep acceptor level between the valence and conduction bands. Actually, there are two deep levels in gallium arsenide and indium phosphide that are provided by copper and are known as Cu$_A$ and Cu$_B$ centers. As illustrated in FIG. 2, the band gap between the conduction and valence bands of gallium arsenide is 1.42 eV while the Cu center provides an acceptor level 0.44 eV above the valence band. Copper in indium phosphide provides an acceptor level even farther above the valence band.

In addition to the compounds listed above, possible semiconductor materials include indirect semiconductors with impurities which introduce recombination centers and also have the other characteristics discussed below for gallium arsenide and indium phosphide. In high power applications, it is desirable for the semiconductor material to have a bandgap greater than approximately 1.2 eV between the valence and conduction bands.

The photo-excitation cross section of electrons and holes in gallium arsenide and indium phosphide were measured by Kullendorff et al. as illustrated in FIGS. 3A–3D. In gallium arsenide, the onset of electron photo-excitation (FIG. 3A) occurs at approximately 1.07 eV, while the onset of hole photo-excitation (FIG. 3B) occurs at 0.4 eV. The peak electron photo-excitation cross section (10$^{-17}$ cm$^2$) is smaller by one order of magnitude than the hole photo-excitation cross section (10$^{-16}$ cm$^2$), but compared to many compounds, the electron photo-excitation cross section is relatively large. In indium phosphide, the onset of electron photo-excitation (FIG. 3C) occurs at approximately 0.8 eV, while the onset of hole photo-excitation (FIG. 3D) occurs between 0.5 and 0.55 eV. Both electron and hole photo-excitation cross sections have a peak value of approximately 5×10$^{-17}$ cm$^2$ in indium phosphide which in this respect makes indium phosphide preferable to gallium arsenide.

The electron and hole capture cross sections for Cu$_B$ centers (which are of primary interest) in gallium arsenide are 8×10$^{-21}$ cm$^2$ at 250° K. and 3×10$^{-14}$ cm$^2$ at 300° K., respectively. The electron capture cross section exhibits only a weak temperature dependence, but the hole capture cross section decreases slowly with increasing temperature. Electron and hole capture cross sections for both Cu$_A$ and Cu$_B$ were measured for indium phosphide by Kullendorff et al. The electron and hole capture cross sections for InP:Cu$_A$ are 6×10$^{-20}$ cm$^2$ and 1.3×10$^{-13}$ cm$^2$, respectively, at 120° K., while the hole capture cross section for InP:Cu$_B$ is 6×10$^{-15}$ cm$^2$. Thus, either copper-doped gallium arsenide or copper-doped indium phosphide may be used as the semiconductor material in a switch according to the present invention.

Figure 4:
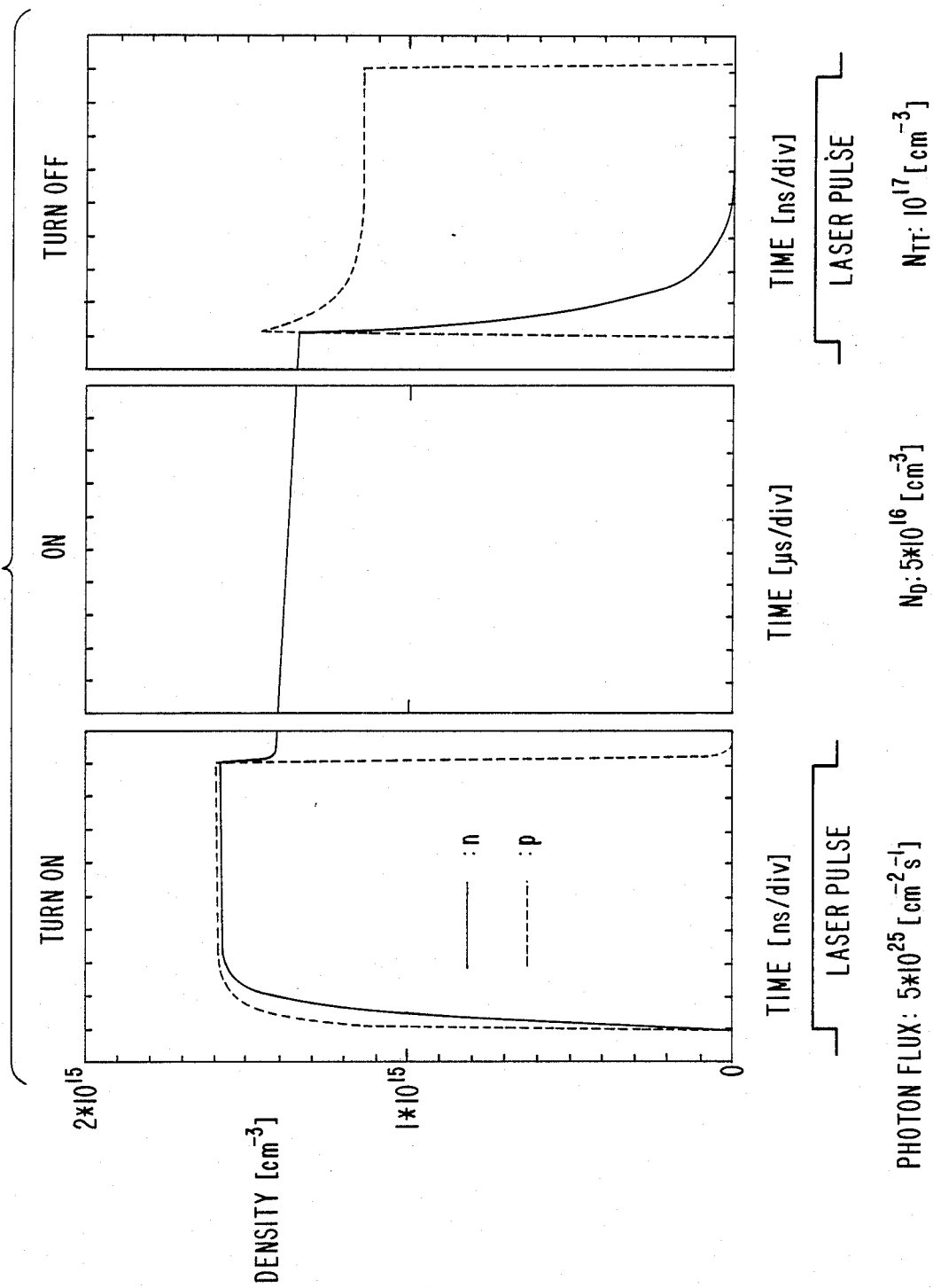
FIG. 4 is a graph of hole and electron density versus time during switching of a GaAs switch according to the present invention.

The photon energy required to turn ON a switch constructed as described above is therefore at least 1.1 eV for gallium arsenide and 0.8 eV for indium phosphide. This corresponds to a wavelength of less than 1.15 microns for gallium arsenide and 1.55 microns for indium phosphide in the first beam from the laser 20. As illustrated in FIG. 4, a relatively short, 2-10 ns laser pulse P is sufficient to generate photo-excitation to provide a high concentration (density) n of electrons. When the laser is turned off, direct recombination of electrons and holes causes a sharp drop to an electron density of $N_O$. Thereafter, trapping of electrons occurs at a slower rate determined by the occupancy of the $Cu_B$ centers and the electron capture cross section. The electron capture cross section is small compared to the cross section for direct electron-hole recombination; therefore, the block 12 of semiconductor material continues to conduct electricity using electrons injected by the second electrical conductor 16 for a substantial period of time after the first beam is turned off. If very long periods of conduction are required, repeated pulses of light at a low wavelength can be used to keep the switch ON.

The laser-induced initial increase in holes does not contribute significantly due to the conductivity of the semiconductor block 12, due to the relatively small mobility of holes compared to that of electrons in indium phosphide and gallium arsenide. The electron mobility is 8,500 $cm^2/Vs$ in gallium arsenide and 4,000 $cm^2/Vs$ in indium phosphide, while the hole mobility is only 400 $cm^2/Vs$ and 100 $cm^2/Vs$ in gallium arsenide and indium phosphide, respectively, all at room temperature.

The switch is turned off by smaller photon energies, i.e., 0.4–1.05 eV in gallium arsenide and 0.55–0.8 eV in indium phosphide. This corresponds to wavelengths of 1.15–3.1 microns in gallium arsenide and 1.55–2.25 microns in indium phosphide in the second beam from the laser 20.

Many of the features and advantages of the present invention are apparent from the detailed specification, and thus, it is intended by the appended claims to cover all such features and advantages which fall within the spirit and scope of the invention. A switch constructed according to the present invention has many possible applications, a few of which include high power switching in, e.g., an inductive storage unit, and a bistable electronic device in, e.g., a memory device. Further, since numerous modifications and changes will readily occur to those skilled in the art, from the disclosure of the invention, it is not desired to limit the invention to the exact construction and operation illustrated and described. Accordingly, suitable modifications and equivalents may be resorted to, all falling within the scope and spirit of the invention.

What is claimed is:

1. A switch operatively connectable between first and second electrical conductors, comprising:
   a block of semiconductor material having ohmic contacts operatively connectable to the first and second electrical conductors and having a deep acceptor level between conduction and valence bands; and
   electromagnetic radiation means for directing a first beam onto said block between the ohmic contacts to cause photo-excitation of electrons from the deep acceptor level into the conduction band to provide initial electrons for conduction between the first and second electrical conductors and for directing a second beam onto said block between the ohmic contacts to cause electrons from the conduction band and holes from the deep acceptor level to combine, thereby interrupting conduction between the first and second electrical conductors.

2. A switch as recited in claim 1, wherein a voltage drop occurs across said block of semiconductor material from the first electrical conductor to the second electrical conductor, and
   wherein the initial electrons resulting from the photo-excitation caused by the first beam from said electromagnetic radiation means flow toward the first electrical conductor and additional electrons are injected from the second electrical conductor to maintain conduction, whereby conduction between the first and second electrical conductors through said block of semiconductor material continues after said electromagnetic radiation means stops directing the first beam onto said block, until said electromagnetic radiation means directs the second beam onto said block.

3. A switch as recited in claim 2, wherein said block of semiconductor material is an indirect semiconductor and contains impurities which introduce recombination centers.

4. A switch as recited in claim 2, wherein the first and second beams directed onto said block of semiconductor material by said electromagnetic radiation means have first and second wavelengths, respectively, the second wavelength being longer than the first wavelength.

5. A switch as recited in claim 2, wherein said block of semiconductor material has an electron photo-excitation cross section, relatively large compared to a hole photoexcitation cross section.

6. A switch as recited in claim 2, wherein said block of semiconductor material has an electron capture cross section relatively small compared to a hole capture cross section.

7. A switch as recited in claim 2, wherein the block of semiconductor material has a band gap greater than 1.2 electron volts between the valence band and the conduction band.

8. A switch as recited in claim 2, wherein said block of semiconductor material consists essentially of one of gallium arsenide, indium phosphide, zinc oxide, cadmium sulfide, gallium arsenic phosphide and alluminum gallium arsenide.

9. A switch as recited in claim 2, wherein said ohmic contacts are operatively connected to control circuits to form an optically controlled bistable electronic device.

10. A switch as recited in claim 2, wherein said block of semiconductor material is a direct semiconductor of substantially uniform consistency.

11. A switch as recited in claim 2, wherein said block of semiconductor material consists essentially of one of gallium arsenide and indium phosphide.

12. A switch as recited in claim 9, wherein said optically controlled bistable electronic device forms one storage element in a memory device.

13. A switch as recited in claim 10, wherein said block of semiconductor material contains impurities which introduce the deep acceptor level and a shallow donor level.

14. A switch as recited in claim 11,
   wherein said block of semiconductor material consists essentially in indium phosphide, and
   wherein the first beam has a first wavelength smaller than approximately 1.55 microns and the second beam has a second wavelength between approximately 1.55 and 2.25 microns.

15. A switch as recited in claim 11,
wherein said block of semiconductor material consists essentially of gallium arsenide, and
wherein the first beam has a first wavelength smaller than approximately 1.15 microns and the second beam has a second wavelength between approximately 1.15 and 3.10 microns.

16. A switch as recited in claim 15, wherein the impurities include at least one of copper and chromium.

* * * * *